United States Patent [19]

Royds

[11] Patent Number: 5,497,125
[45] Date of Patent: Mar. 5, 1996

[54] CURRENT SENSE CIRCUIT APPARATUS FOR POWER AMPLIFIER CONTROL

[75] Inventor: Ian D. Royds, Shamley Green, Great Britain

[73] Assignee: Vtech Communications, Ltd., Hong Kong

[21] Appl. No.: 252,261

[22] Filed: Jun. 1, 1994

[30] Foreign Application Priority Data

Jun. 2, 1993 [GB] United Kingdom ................... 9311338

[51] Int. Cl.⁶ ............................ H03F 1/30; H03G 3/30
[52] U.S. Cl. ..................... 330/290; 330/136; 330/285; 330/298
[58] Field of Search ............................. 330/129, 133, 330/136, 207 P, 285, 290, 297, 298

[56] References Cited

U.S. PATENT DOCUMENTS 3,644,832  2/1972  Sherman, Jr. ...................... 325/186
4,158,180  7/1979  Challen ............................. 330/298

Primary Examiner—Steven Mottola
Attorney, Agent, or Firm—Dick and Harris

[57] ABSTRACT

A power control system for controlling the power output of a power amplifier. The power control system draws power from a variable voltage supply, such as a battery, and receives a signal input which indicates the desired power output. The power control system includes a power amplifier for amplifying an electrical signal which draws a current from the variable voltage supply. The power amplifier is of the type wherein the operating current drawn by the power amplifier is indicative of the power output. The power control system additionally includes a current sense circuit, which is operably connected between the variable voltage supply and the power amplifier and which senses the current drawn by the power amplifier and simultaneously produces an output current, which is directly correlated to the sensed current. The output current and the signal input are compared in a controller which produces a control signal for controlling the power output by the power amplifier.

26 Claims, 1 Drawing Sheet

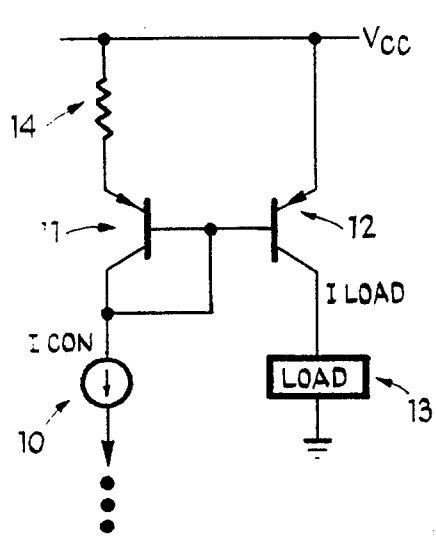
*Fig 1*
PRIOR ART
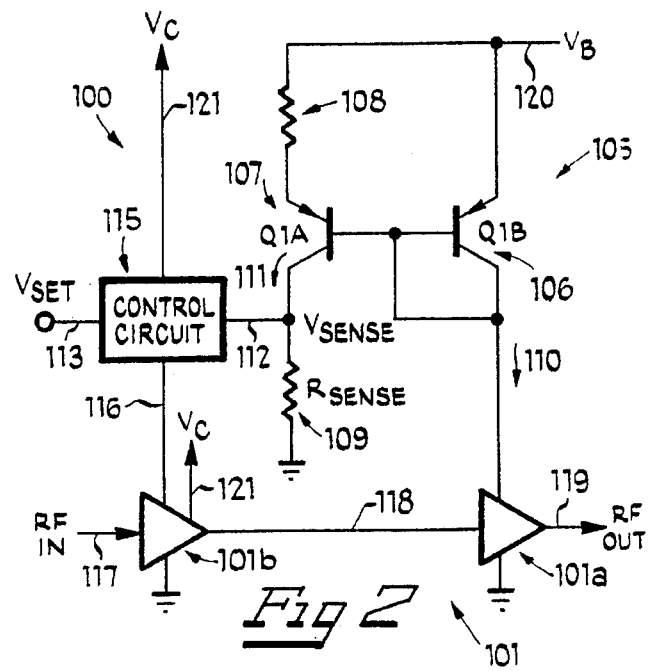
*Fig 2*
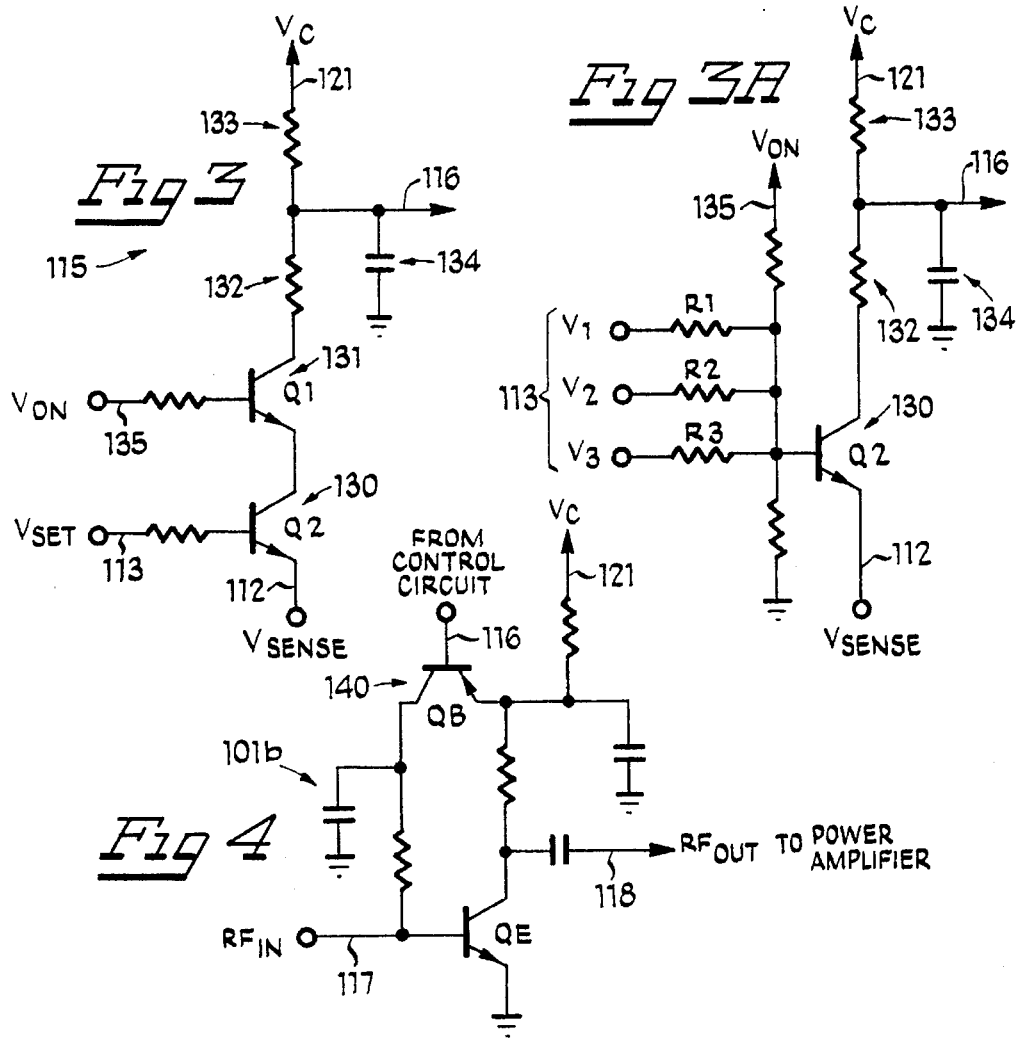
*Fig 3*
*Fig 3A*
*Fig 4*

CURRENT SENSE CIRCUIT APPARATUS FOR POWER AMPLIFIER CONTROL

BACKGROUND OF THE INVENTION

1. Field of the Invention

The present invention relates in general to power control apparatuses and, in particular, to a power control system for measuring the current drawn by a power amplifier which is indicative of its power output and altering the input to the power amplifier so as to alter its power output.

2. Background Art

Power amplifiers are used in radio transmitters to produce a signal with sufficient power for transmitting over a distance. Most, if not all, radio transmitters measure the power output of this amplifier, toward being able to adjust the output of this amplifier to match a desired value. The most widely used approach to accomplish this measurement utilizes a directional coupler on the post power amplifier transmission line which is connected to a diode detector. Overall, this approach is expensive to implement, both financially and in terms of space requirements. This is particularly true in high frequency radio applications where Schottky diodes—which are rather expensive—would be necessary to provide an accurate measurement of minor variations in power amplifier output.

Current mirrors have long been utilized in electrical circuits as a current source device. Particularly in integrated circuits, multiple current mirrors are used to "steer" an externally generated current in various multiples of the known generated current to various portions of the circuit. These uses of the current mirror all require a constant current source to supply the mirror with a known programming current, which, in turn, sets the various currents.

Another approach to power output measurement measures the operating current drawn by the power amplifier. The operating current drawn by the power amplifier is related to the amplifier output power, or gain, such that measuring the current drawn by the power amplifier may be used to determine its output power. This approach is valid for class B, C or BC power amplifiers. These power amplifier classes draw an operating current proportional to their power output. The measurement of this current can be accomplished in various conventional ways, such as inserting a resistor in the source line and measuring the voltage drop across the resistor using an operational amplifier; an expensive approach. The introduction of a resistor into this line diminishes the power received by the power amplifier. Of course, the value of the resistor can be minimized to minimize power dissipation, however, this would be at the expense of requiring a more sensitive operational amplifier, which is increasingly expensive given increased sensitivity.

It is thus an object of the present invention to provide a low-cost approach to measuring the power output of a power amplifier.

It is a further object to provide a measuring approach which introduces a minimal voltage drop into the connection between the power source and the amplifier.

These and other objects will become apparent in light of the attached specification and drawings.

SUMMARY OF THE INVENTION

A preferred embodiment of the invention comprises a power control system for controlling the power output of a power amplifier. The power control system draws power from a variable voltage supply, such as a battery, and receives a signal input which indicates the desired output of the power amplifier. The power control system includes power amplifier means for amplifying an electrical signal wherein the power amplifier means draws an operating current from the variable voltage supply. The power amplifier means is of the type wherein this drawn current is indicative of the power output of the power amplifier means.

The power control system also includes current sense means operably connected between the variable voltage supply and power amplifier means for sensing the current drawn by the power amplifier means and simultaneously producing an output signal, which is directly correlated to the sensed drawn current.

The power control system further includes control means which operably accepts the output signal from the current sense means and a signal input toward comparing the two signals so as to produce a control signal for controlling the power output of the power amplifier means.

In a preferred embodiment, the current sense means is configured so as to minimize the voltage drop between the power amplifier means and the variable source voltage to, in turn, minimize the draw on the variable voltage supply. This preferred embodiment includes two matched transistors; a first transistor with its emitter connected to the variable voltage supply and collector connected to the power amplifier, and a second transistor operably connected by its emitter to the variable voltage supply and by its base to the base of the first transistor. The bases of the first and second transistors are further coupled to the collector of the first transistor. Thus, in this embodiment, the sensed current travels through the first transistor and the output signal is outputted from the collector of the second transistor.

In this embodiment, the current sense means may further include ratio means electrically connected to the second emitter for setting a ratio between the current drawn by the power amplifier means and the current output by the second transistor which may comprise a resistor or may involve adjusting the relative sizes of the emitter junctions of the first and second transistors. In a preferred embodiment, the ratio is chosen to minimize the draw on the variable voltage source and further to minimize temperature concerns.

In this preferred embodiment, the apparatus further includes a current-to-voltage converter means, which may comprise a resistor, for converting the sensed current into a sensed voltage. This resistor may be chosen so as to offset any temperature effects in the operation of the first and second transistors.

In a preferred embodiment, the current sense means outputs a voltage to the control means. In this embodiment, the control means includes a comparitor transistor, its base connected to the signal input, which is a voltage set point, and its emitter connected to the sensed voltage from the current sense means. The collector of the comparitor transistor is operably connected to an exciter through a protection resistor which protects the bias control transistor of the exciter. The control means further includes a charge-up resistor operably connected between a supply voltage and the protection resistor. The control means additionally includes a capacitor operably connected between the protection resistor and ground, so as to prevent oscillation of the apparatus by providing a delay in combination with the charge-up resistor and the protection resistor.

In a preferred embodiment, the control means further includes a switching transistor operably connected between the comparitor transistor and the protection resistor. The base of the switching transistor is tied to an activation signal, which indicates whether the power amplifier should be enabled.

In operation, when the power amplifier means draws a first current from the variable voltage supply, the current sense means draws a second current from the variable power source wherein the first current is a multiple of the second current, based upon the value of the ratio means. The second current is converted into a first voltage by a resistor whose value has been chosen to compensate for any temperature variance in the current sense means. This first voltage is then compared with the predetermined power setting—represented by the signal input applied to the comparitor transistor—resulting in a second voltage which is applied to bias the power amplifier means toward altering the power output of the power amplifier means.

BRIEF DESCRIPTION OF THE DRAWINGS

FIG. 1 of the drawings is a block schematic diagram of a prior art current mirror showing, in particular, a constant current source programming the current provided to a load;

FIG. 2 of the drawings is a schematic block diagram of the present power control system;

FIG. 3 of the drawings is a schematic diagram of a preferred embodiment of the control means;

FIG. 3A of the drawings is a schematic diagram of a second embodiment of the control means; and FIG. 4 of the drawings is a schematic diagram of the exciter showing, in particular, the interconnection of the control means and the exciter.

DETAILED DESCRIPTION OF THE DRAWINGS

While this invention is susceptible of embodiment in many different forms and in many different systems, there is shown in the drawings and will herein be described in detail, one specific embodiment in one representative system with the understanding that the present disclosure is to be considered as an exemplification of the principles of the invention and is not intended to limit the invention to the embodiment or the system illustrated.

FIG. 1 of the drawings is a schematic diagram of a prior art current mirror. The mirror shown in FIG. 1 is programmed by constant current source 10 by it sinking a known current, Icon, from the collector of transistor 11 resulting in a current in transistor 12, being used to source load 13. The value of the current source by transistor 12 is a function of the value of resistor 14.

FIG. 2 of the drawings is a schematic block diagram of power control system 100 of the present invention. Power control system 100 controls the power output of power amplifier means 101. In a preferred embodiment, power amplifier means 101 is comprised of power amplifier 101a and exciter 101b. Power amplifier 101a may be a class B, or BC type C amplifier wherein the current drawn by power amplifier 101a from variable voltage supply 120 is indicative of its power output. In a preferred embodiment, power amplifier 101a is a class BC amplifier which draws no current whatsoever unless it is driven by exciter 101b.

Exciter 101b is a class A amplifier forced to run in compression, i.e. non-linear mode, by providing $RF_{in}$ 117 to have such power that the power of exciter output 118 is compressed. The output of exciter 101b is operably connected to and drives power amplifier 101a which draws a current from variable voltage supply 120.

Variable voltage supply 120, which may comprise a battery (not shown), may be used to power control system 100, as well as any electrical circuitry in a product utilizing apparatus 100. It is possible, though, for control means 115 and exciter 101b to be powered by separate supply voltage 121, which must only be greater than $V_{sense}$ 112, so that control means 115 and exciter 101b can operate properly.

Power control apparatus 100 further includes current sense means 105 for sensing sensed current 110 drawn by power amplifier means 101 and simultaneously producing output current 111. Output current 111 which is also drawn from variable voltage supply 120 is directly correlated to sensed current 110. Current sense means 105 is operably connected between variable voltage supply 120 and power amplifier means 101 and is configured to minimize the voltage drop between variable voltage supply 120 and power amplifier 101a of power amplifier means 101.

In a preferred embodiment, current sense means 105 includes first transistor 106 and second transistor 107, which are matched—and preferably reside on the same IC chip so as to minimize temperature variations. The emitter of first transistor 106 is operably connected to variable voltage supply 120 and the collector is operably connected to power amplifier 101a. The base of first transistor 106 and base of second transistor 107 are also operably connected together and also to the collector of first transistor 106. In this embodiment, the emitter of second transistor 107 is operably connected to variable voltage supply 120 through ratio means 108, which may be a resistor, but may instead involve varying the relative emitter junction sizes of first transistor 106 and second transistor 107.

In operation, second transistor 107 is programmed by sensed current 110 which is drawn by power amplifier 101a through first transistor 106. Because power amplifier 101a is of the type in which the drawn current is indicative of its output power, sensed current 110 indicates the power output of power amplifier means 101. Output current 111 is a multiple of sensed current 110 dependent upon the value of ratio means 108. In a preferred embodiment, ratio means 108 is set such that output current 111 is approximately one-tenth sensed current 110 to further minimize the draw of variable voltage supply 120 and minimize temperature concerns.

In a preferred embodiment, output current 111 is converted to $V_{sense}$ 112 by current-to-voltage converter means 109, which may comprise a resistor electrically connected to ground. Resistor 108 may additionally be chosen so as to offset any temperature effects in the operation of first transistor 106 and second transistor 107. In a preferred embodiment, $R_{sense}$ 109 is one hundred and twenty ohms.

Power control apparatus 100 finally includes control means 115 for comparing $V_{sense}$ 112 to $V_{set}$ 113, so as to produce bias control signal 116 for controlling the power output by power amplifier means 101. In a preferred embodiment shown in FIG. 3, control means 115 includes comparator transistor 130, which compares $V_{sense}$ 112 to $V_{set}$ 113. The base of comparitor transistor 130 is operably connected to $V_{set}$ 113 through a base protection resistor. $V_{set}$ 113 may be produced by any number of sources, such as a microprocessor having a digital-to-analog converter output. The emitter of comparator transistor 130 is operably connected to $V_{sense}$ 112 such that the collector of comparator transistor 130 sources an output indicative of the required power change. The collector of comparator transistor 130 is operably connected to protection resistor 132 which protects bias control transistor 140 of exciter 101b (shown in FIG. 4).

Bias control signal 116 is fed directly into exciter 101b. In another embodiment, bias control signal 116 can be fed into a stage prior to power amplifier means 101, wherein it can affect the power of $RF_{in}$ 117. In this alternative embodiment, protection resistor 132 would still be included for its use as a time constant.

Control means 115 further includes charge-up resistor 133, which is operably connected between supply voltage 121 and protection resistor 132. Supply voltage 121 can be any value greater than $V_{sense}$ 112, including the same value as variable voltage supply 120. Supply voltage 121 must also be supplied to exciter 101b for the circuit to operate correctly. Charge-up resistor 133 and protection resistor 132 individually, in combination with capacitor 134, prevents oscillation of control means 115, and in turn apparatus 100, by providing a delay, such that transient power changes— including current charges caused by control means 115—are ignored unless maintained.

In a preferred embodiment, control means 115 further comprises switching transistor 131 operably connected between comparator transistor 130 and protection resistor 132. The base of switching transistor 131 is connected to $V_{on}$ 135, which indicates whether power amplifier means 101 should be enabled. For instance, in a radio system which partially powers down while idle, $V_{on}$ 135 is used to turn the transmitter off so it does not needlessly drain power. In a second embodiment, shown in FIG. 3A, comparitor transistor 130 and switching transistor 131 are combined into one transistor by utilizing a summer circuit consisting of $V_{set}$ 113 divided into three components each of which are fed through weighted resistors R1, R2 and R3 and $V_{on}$ 135 which is fed through resistor Ron.

FIG. 4 is a schematic diagram of exciter 101b showing, in particular, the interconnection of exciter 101b and control means 115. As is shown, bias control signal 116 from control means 115 is fed into the base of bias control transistor 140. This serves to alter the power output of exciter 101b, which in turn alters the power output by power amplifier 101a. It is possible, of course, to maintain a constant bias voltage on bias control transistor 140 and feed bias control signal 116, which is a bias voltage, directly into the RF signal either before it enters exciter 101b or before it enters power amplifier 101a. This is particularly true because of the flexibility of $V_{set}$ 113 and $V_{sense}$ 112. In a preferred embodiment, $R_{sense}$ 109 has been chosen to compensate for temperature variations. Thus, at the expense of losing temperature compensation, $R_{sense}$ 109 can take almost any value and, in turn, allow $V_{sense}$ 112 take any value which when compared to $V_{set}$ 113 can provide any desired bias control signal 116.

The foregoing description and drawings merely explain and illustrate the invention and the invention is not limited thereto, except insofar as the appended claims are so limited and as those skilled in the art who have the disclosure before them will be able to make modifications and variations therein without departing from the scope of the invention.

I claim:

1. A power control system for controlling the power output of a power amplifier, said power control system drawing power from a variable voltage supply, such as a battery, and receiving a signal input for indicating the desired power output, said power control system comprising:

power amplifier means for amplifying an electrical signal, said power amplifier means drawing a current from said variable voltage supply, said power amplifier means of the type wherein said drawn current is indicative of the power output from said power amplifier means;

current sense means operably connected between the variable voltage supply and the power amplifier means for sensing the current drawn by the power amplifier and for simultaneously producing an output current, wherein said output current is directly correlated to said sensed current; and control means operably accepting said output current and the signal input for comparing said output current to said signal input so as to produce a control signal for controlling the power output by said power amplifier means.

2. The invention according to claim 1 wherein said current sense means is configured so as to minimize the voltage drop between the power amplifier means and the variable source voltage to, in turn, minimize the draw on the variable voltage supply.

3. The invention according to claim 1 wherein said current sense means comprises:

a first transistor having a first emitter, first collector and first base, said first transistor being located between the variable voltage supply and the power amplifier, such that said sensed current travels through said first transistor;

a second transistor having a second emitter, second collector and second base;

said first and second emitters being electrically connected to the variable voltage supply; and said first and second bases being electrically coupled to each other and further coupled to said first collector, such that said output signal is output from said second collector;

4. The invention according to claim 3 further comprising ratio means electrically connected to said second emitter for setting a ratio between said sensed current and said output current.

5. The invention according to claim 4 wherein said ratio means comprises a resistor.

6. The invention according to claim 4 wherein said ratio means is achieved by adjusting the relative sizes of said first and second emitter junctions.

7. The invention according to claim 1 further comprising a current-to-voltage converter means for converting said output current into a sensed voltage.

8. The invention according to claim 7 wherein said current-to-voltage converter means comprises a resistor electrically connected between said second collector and ground.

9. The invention according to claim 8 wherein said resistor is chosen so as to offset any temperature effects in the operation of said first and second transistors.

10. The invention according to claim 1 wherein said output current is converted to a voltage, said control means comprises:

a comparator transistor having its base electrically connected to a voltage set point, its emitter connected to said indicative output;

a protection resistor operably connected between the collector of said comparator transistor and the exciter so as to protect the bias control transistor of the exciter;

a charge-up resistor operably connected between a supply voltage and said protection resistor, said supply voltage being greater than said sensed voltage and further being supplied to the exciter; and a capacitor operably connected between said protection resistor and ground, so as to prevent oscillation of said apparatus by providing a delay in combination with said charge-up resistor and said protection resistor.

11. The invention according to claim 10 wherein said control means further comprises a switching transistor operably connected between said comparator transistor and said protection resistor having its base tied to an activation signal, which indicates whether the power amplifier should be enabled.

12. A method for controlling the power output of a power amplifier such that the power output is substantially equal to a predetermined power setting wherein the power amplifier draws power from a variable power source and receives an input from an exciter, said method comprising the step of:

drawing a first current from variable power source toward and into the power amplifier;

drawing a second current from variable power source toward and into a control circuit, wherein the first current is a multiple of the second current;

converting the second current to a first voltage;

comparing the first voltage with the predetermined power setting so as to create a second voltage; and applying the second voltage to bias the exciter or the power amplifier toward altering the power output of the power amplifier.

13. The invention according to claim 3 further comprising a current-to-voltage converter means for converting said output current into a sensed voltage.

14. A power control system for controlling the power output of a power amplifier, said power control system drawing power from a variable voltage supply, such as a battery, and receiving a signal input for indicating the desired power output, said power control system comprising:

power amplifier means for amplifying an electrical signal, said power amplifier means drawing a current from said variable voltage supply, said power amplifier means of the type wherein said drawn current is indicative of the power output from said power amplifier means;

current sense means operably connected between the variable voltage supply and the power amplifier means for sensing the current drawn by the power amplifier and for simultaneously producing an output current, wherein said output current is directly correlated to said sensed current, said current sense means being configured so as to minimize the voltage drop between the power amplifier means and the variable source voltage to, in turn, minimize the draw on the variable voltage supply; and control means operably accepting said output current and the signal input for comparing said output current to said signal input so as to produce a control signal for controlling the power output by said power amplifier means.

15. The invention according to claim 14 further comprising a current-to-voltage converter means for converting said output current into a sensed voltage.

16. The invention according to claim 15 wherein said control means comprises:

a comparator transistor having its base electrically connected to a voltage set point, its emitter connected to said indicative output;

a protection resistor operably connected between the collector of said comparator transistor and the exciter so as to protect the bias control transistor of the exciter;

a charge-up resistor operably connected between a supply voltage and said protection resistor, said supply voltage being greater than said sensed voltage and further being supplied to the exciter; and a capacitor operably connected between said protection resistor and ground, so as to prevent oscillation of said apparatus by providing a delay in combination with said charge-up resistor and said protection resistor.

17. A power control system for controlling the power output of a power amplifier, said power control system drawing power from a variable voltage supply, such as a battery, and receiving a signal input for indicating the desired power output, said power control system comprising:

a power amplifier that draws a current from said variable voltage supply having an input and an output, said power amplifier of the type wherein said drawn current is indicative of the power output from said power amplifier;

an exciter circuit having an input and an output, said exciter circuit output being operably connected to said power amplifier input;

a first transistor having a first emitter, first collector and first base, said first transistor being located between the variable voltage supply and said power amplifier and having a first current flowing therethrough;

a second transistor having a second emitter, second collector and second base, said second transistor having a second current flowing therethrough;

said first and second emitters being electrically connected to the variable voltage supply;

said first and second bases being electrically coupled to each other and further coupled to said first collector; and control means operably connected to said second collector and the signal input for comparing said second current to said signal input so as to produce a control signal for controlling the power output by said power amplifier.

18. The invention according to claim 17 further comprising ratio means electrically connected to said second emitter for setting a ratio between said first and second currents.

19. The invention according to claim 18 wherein said ratio means comprises a resistor.

20. The invention according to claim 18 wherein said ratio means is achieved by adjusting the relative sizes off said first and second emitter junctions.

21. The invention according to claim 17 further comprising a current-to-voltage converter means for converting said second current into a sensed voltage.

22. The invention according to claim 21 wherein said current-to-voltage converter means comprises a resistor electrically connected between said second collector and ground.

23. The invention according to claim 22 wherein said resistor is chosen so as to offset any temperature effects in the operation of said first and second transistors.

24. The invention according to claim 17 wherein said output current is converted to a voltage, said control means comprises:

a comparator transistor having its base electrically connected to a voltage set point, its emitter connected to said indicative output;

a protection resistor operably connected between the collector of said comparator transistor and the exciter so as to protect the bias control transistor of the exciter;

a charge-up resistor operably connected between a supply voltage and said protection resistor, said supply voltage being greater than said sensed voltage and further being supplied to the exciter; and a capacitor operably connected between said protection resistor and ground, so as to prevent oscillation of said apparatus by providing a delay in combination with said charge-up resistor and said protection resistor.

25. The invention according to claim 24 wherein said control means further comprises a switching transistor operably connected between said comparator transistor and said protection resistor having its base tied to an activation signal, which indicates whether the power amplifier should be enabled.

26. A power control system for controlling the power output of a power amplifier, said power control system drawing power from a variable voltage supply, such as a battery, and receiving a signal input for indicating the desired power output, said power control system comprising:

power amplifier means for amplifying an electrical signal, said power amplifier means drawing a current from said variable voltage supply, said power amplifier means of the type wherein said drawn current is indicative of the power output from said power amplifier means;

current sense means operably connected between the variable voltage supply and said power amplifier means for sensing the current drawn by the power amplifier and for simultaneously producing an output current, wherein said output current is directly correlated to said sensed current;

a comparator transistor having its base electrically connected to a voltage set point, its emitter connected to said indicative output;

a protection resistor operably connected between the collector of said comparator transistor and the exciter so as to protect the bias control transistor of the exciter;

a charge-up resistor operably connected between a supply voltage and said protection resistor, said supply voltage being greater than said sensed voltage and further being supplied to the exciter; and a capacitor operably connected between said protection resistor and ground, so as to prevent oscillation of said apparatus by providing a delay in combination with said charge-up resistor and said protection resistor.

* * * * *